United States Patent
Rofougaran

(10) Patent No.: US 7,860,464 B2
(45) Date of Patent: Dec. 28, 2010

(54) METHOD AND SYSTEM FOR A PROGRAMMABLE LOCAL OSCILLATOR GENERATOR BASED ON QUADRATURE MIXING USING A PHASE SHIFTER

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 601 days.

(21) Appl. No.: 11/864,845

(22) Filed: Sep. 28, 2007

(65) Prior Publication Data

US 2009/0085611 A1    Apr. 2, 2009

(51) Int. Cl.
*H04B 1/40* (2006.01)
(52) U.S. Cl. .................. 455/76; 455/139; 455/147; 455/165.1
(58) Field of Classification Search .............. 455/76, 455/139, 147, 165.1, 183.1, 209, 236.1, 255, 455/260, 304, 315
See application file for complete search history.

(56) References Cited

U.S. PATENT DOCUMENTS

| | | | | |
|---|---|---|---|---|
| 5,822,704 A | * | 10/1998 | Ishii | 455/553.1 |
| 5,950,119 A | * | 9/1999 | McGeehan et al. | 455/302 |
| 5,982,807 A | * | 11/1999 | Snell | 375/146 |
| 6,778,594 B1 | * | 8/2004 | Liu | 375/222 |

\* cited by examiner

*Primary Examiner*—Tuan A Pham
(74) *Attorney, Agent, or Firm*—McAndrews, Held & Malloy, Ltd.

(57) ABSTRACT

Methods and systems for a local oscillator generator based on quadrature mixing using a phase shifter. Aspects of one method may include generating a local oscillator signal, where a frequency of the local oscillator signal may be determined by controlling a phase of in-phase (I) components and quadrature phase (Q) components of a first signal and a second signal. For example, by appropriately controlling a phase of each component that is to be mixed, the local oscillator signal may have a frequency that is the sum of a frequency of the first signal and a frequency of the second signal, or a difference of the frequency of the first signal and the frequency of the second signal.

25 Claims, 6 Drawing Sheets

METHOD AND SYSTEM FOR A PROGRAMMABLE LOCAL OSCILLATOR GENERATOR BASED ON QUADRATURE MIXING USING A PHASE SHIFTER

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a local oscillator generator based on quadrature mixing using a phase shifter.

BACKGROUND OF THE INVENTION

Wireless communication has become pervasive throughout our modern society, leading to crowding of allocated communication spectrums. Accordingly, new communication spectrums are being allocated and used for ever increasing applications. As higher transmission frequencies are used for various applications, circuitry for modulating signals to be transmitted and demodulating received signals may become more costly.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a local oscillator generator based on quadrature mixing using a phase shifter, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a local oscillator generator based on quadrature mixing using a phase shifter. Aspects of the method may comprise generating a base signal, and generating a first signal and a second signal based on the base signal. The first signal may be generated via a direct digital frequency synthesizer. The second signal may be generated via, for example, a phase shifter, which may generate I and Q components of the second signal, and corresponding signals I' and Q'. The signals I' and Q' may be controlled to be inverted versions of the I and Q signals of the second signal.

The components of the first signal and the second signal, and the corresponding signals I' and Q' may be quadrature mixed to generate I and Q components of a local oscillator signal. The phase shifter block may generate the signals I' and Q' such that when the signal I' is 180° out of phase with the component I of the second signal, the signal Q' may be in phase with the component Q of the second signal. Similarly, when the signal I' is in phase with the component I of the second signal, the signal Q' may be 180° out of phase with the component Q of the second signal. Accordingly, by selecting the signal I' to be in phase with the component I of the second signal, the local oscillator signal may comprise a frequency that is a difference of the frequencies of the first signal and the second signal. Similarly, by selecting the signal Q' to be in phase with the component Q of the second signal, the local oscillator signal may comprise a frequency that is a sum of the frequencies of the first signal and the second signal.

Figure 1:
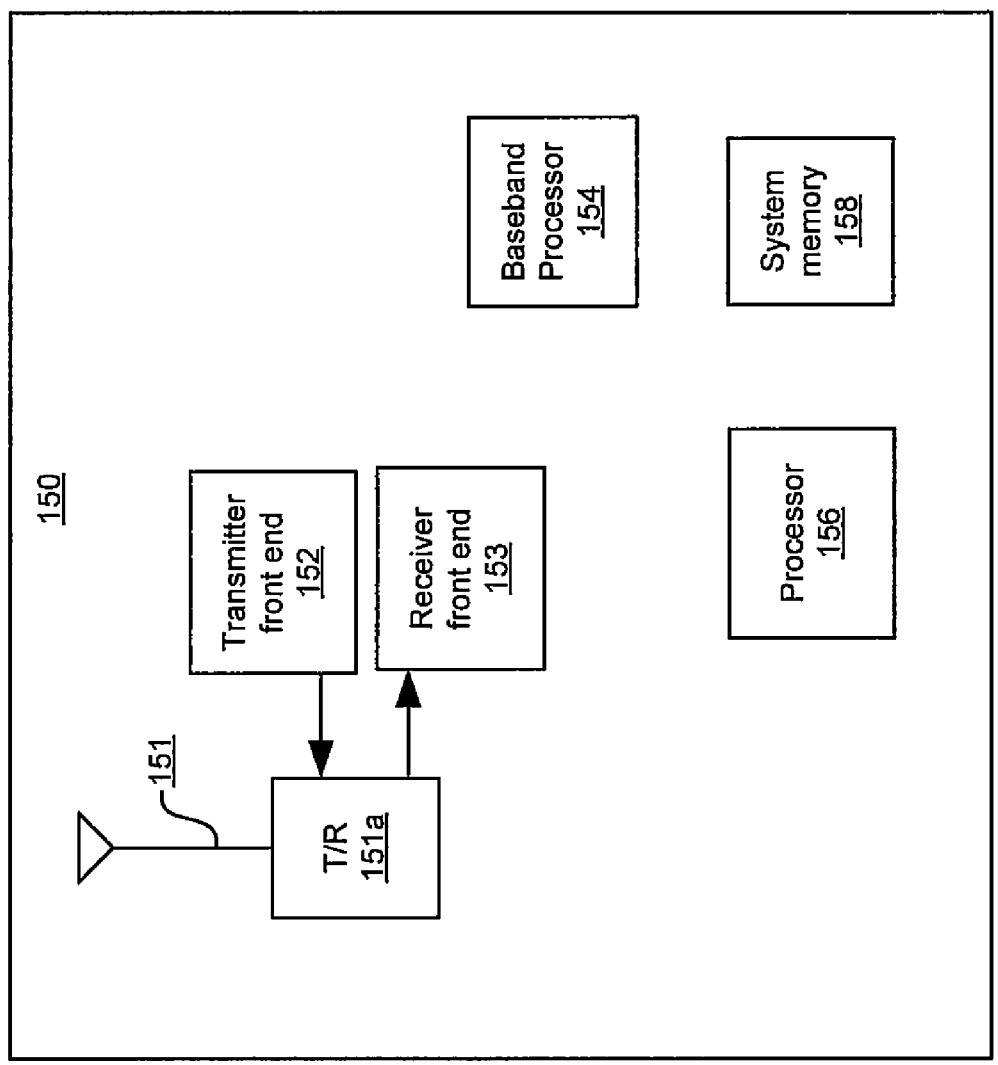
FIG. 1 is a block diagram of an exemplary wireless system, in accordance with an embodiment of the invention.

FIG. 1 is a block diagram of an exemplary wireless system, in accordance with an embodiment of the invention. Referring to FIG. 1, the wireless system 150 may comprise an antenna 151, a transmitter/receiver switch 151a, a transmitter front end 152, a receiver front end 153, a baseband processor 154, a processor 156, and a system memory 158. The transmitter/receiver switch 151a may comprise suitable circuitry that enables the antenna 151 to be used for both receiving and transmitting. The transmitter front end (TFE) 152 may comprise suitable logic, circuitry, and/or code that may be adapted to up-convert a baseband signal directly to an RF signal and to transmit the RF signal via the antenna 151. The TFE 152 may also be adapted to up-convert a baseband signal to an IF signal, and/or up-convert the IF signal to a RF signal and then transmit the RF signal via the antenna 151. The TFE 152 may generate, for example, a local oscillator signal that may be used for the up-conversion. The local oscillator signal may be generated up to and including extremely high frequencies using, for example, a local oscillator generator based on quadrature mixing using a phase shifter. The TFE 152 may be adapted to execute other functions, for example, filtering the baseband signal, and/or amplifying the baseband signal.

The receiver front end (RFE) 153 may comprise suitable logic, circuitry, and/or code that may be adapted to down-convert a RF signal directly to a baseband signal for further processing. The RFE 153 may also be adapted to down-convert a RF signal to an IF signal, and/or down-convert the IF signal to a baseband signal for further processing. The RFE 153 may generate, for example, a local oscillator signal that may be used for the down-conversion. The local oscillator signal may be generated up to and including extremely high frequencies using, for example, a local oscillator generator based on quadrature mixing using a phase shifter. The RFE 153 may be adapted to execute other functions, for example, filtering the baseband signal, and/or amplifying the baseband signal.

The baseband processor 154 may comprise suitable logic, circuitry, and/or code that may be adapted to process baseband signals, for example, convert a digital signal to an analog signal, and/or vice-versa. The baseband processor 154 may also provide control, for example, for generating a local oscillator signal using, for example, a local oscillator generator based on quadrature mixing using a phase shifter. The processor 156 may be a suitable processor or controller such as a CPU or DSP, or any type of integrated circuit processor. The processor 156 may comprise suitable logic, circuitry, and/or code that may be adapted to control the operations of the TFE 152 and/or the baseband processor 154. For example, the processor 156 may be utilized to update and/or modify programmable parameters and/or values in a plurality of components, devices, and/or processing elements in the TFE 152 and/or the baseband processor 154. The processor 156 may also provide control, for example, for generating a local oscillator signal using, for example, a programmable local oscillator generator utilizing DDFS. Furthermore, if the wireless system 150 comprises more than one processor, control and/or data information, which may include the programmable parameters, may be transferred from at least one controller and/or processor to the processor 156. Similarly, the processor 156 may be adapted to transfer control and/or data information, which may include the programmable parameters, to at least one controller and/or processor, which may be part of the wireless system 150.

The processor 156 may utilize the received control and/or data information, which may comprise the programmable parameters, to determine an operating mode of the TFE 152. For example, the processor 156 may be utilized to select a specific frequency for a local oscillator generator, or a specific gain for a variable gain amplifier. Moreover, the specific frequency selected and/or parameters needed to calculate the specific frequency, and/or the specific gain value and/or the parameters needed to calculate the specific gain, may be stored in the system memory 158 via the processor 156. The information stored in system memory 158 may be transferred to the TFE 152 from the system memory 158 via the processor 156. The system memory 158 may comprise suitable logic, circuitry, and/or code that may be adapted to store a plurality of control and/or data information, including parameters needed to calculate frequencies and/or gain, and/or the frequency value and/or gain value.

Figure 2A:
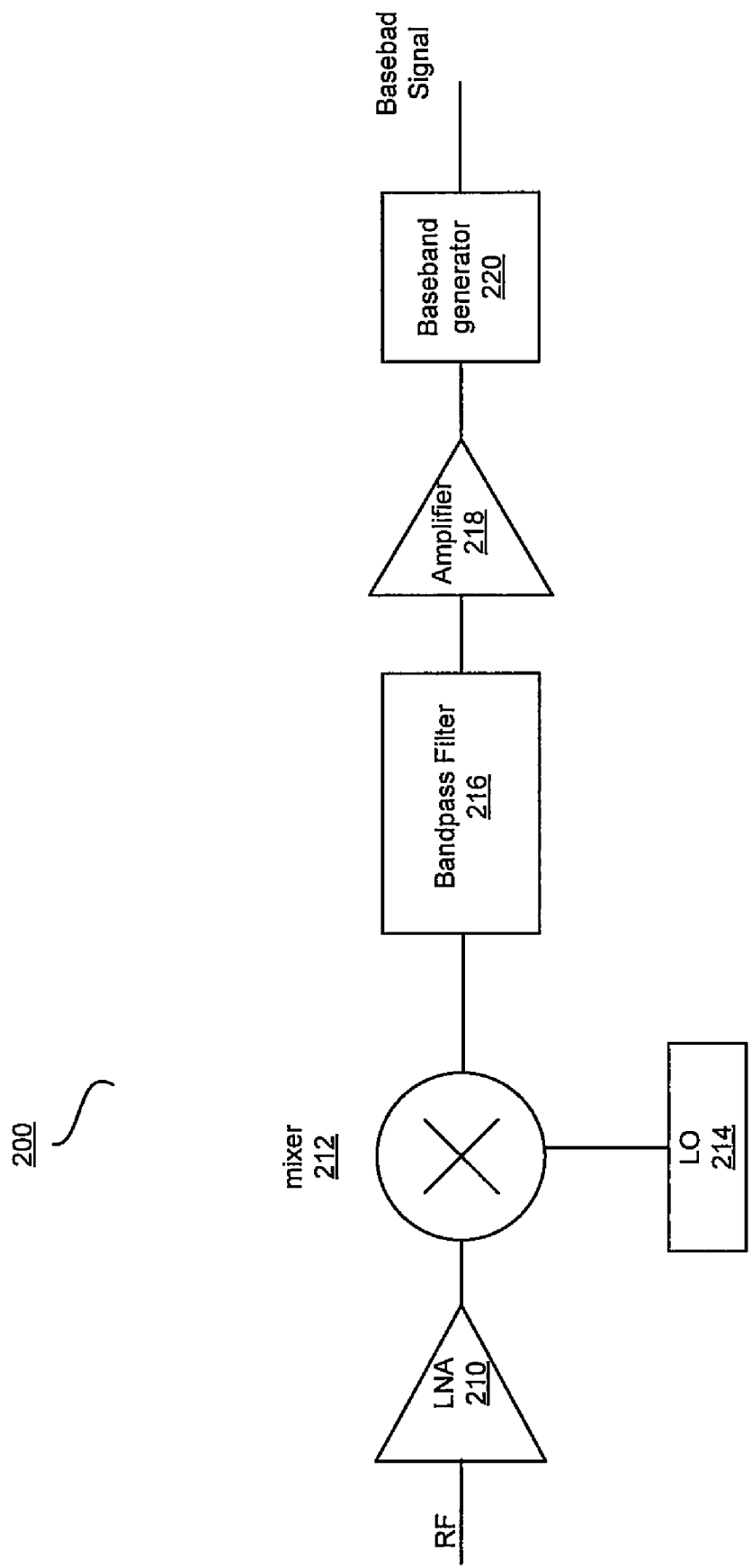
FIG. 2A is a block diagram illustrating an exemplary RF receiver front end, in accordance with an embodiment of the invention.

FIG. 2A is a block diagram illustrating an exemplary RF receiver front end, in accordance with an embodiment of the invention. Referring to FIG. 2A, there is shown an exemplary receive path 200 that comprise amplifiers 210 and 218, a mixer 212, a local oscillator (LO) generator 214, a bandpass filter 216, and a baseband generator 220. The amplifiers 210 and 218 may comprise suitable logic, circuitry, and/or code that may be adapted to amplify input signals and output the amplified signals. The amplifier 210 and/or the amplifier 218 may be a low noise amplifier (LNA). A LNA may be utilized in instances where the signal to noise ratio (SNR) may be relatively low, such as, for example, RF signals received by an antenna. The amplifiers 210 and 218 may also be variable gain amplifiers, where the gain control may be, for example, under a programmable control of a processor 156.

The mixer 212 may comprise suitable logic, circuitry, and/or code that may be adapted to receive two input signals, and generate output signals, where the output signals may be a difference of the frequencies of the two input signals and a sum of the frequencies of the two input signals.

The LO 214 may comprise suitable logic, circuitry, and/or code that may be adapted to output a signal of a specific frequency. The LO 214 is described in more detail with respect to FIGS. 3-5. The bandpass filter 216 may comprise suitable logic, circuitry, and/or code that may be adapted to selectively pass signals within a certain bandwidth while attenuating signals outside that bandwidth.

The baseband generator 220 may comprise suitable logic, circuitry, and/or code that may be adapted to generate analog baseband signal from the IF signal communicated by the amplifier 218. For example, analog down-conversion of the IF signal to analog baseband signal may comprise using a mixer (not shown) similar to the mixer 212. If the baseband processor 154 (FIG. 1) is a digital baseband processor, the analog baseband signal may be converted to digital signal and communicated to the baseband processor 154. An analog to digital converter (ADC) (not shown) may be utilized to digitize the analog IF signal.

Digital down-conversion may comprise digitizing the IF signal, processing the digitized IF signal, for example, filtering and down-converting, to generate a digital baseband signal, which may then be communicated to the baseband processor 154. If the baseband processor 154 is an analog baseband processor, the digital baseband signal may be converted to analog baseband signal and communicated to the baseband processor 154. A digital to analog converter (DAC) (not shown) may be utilized to convert the digital IF signal. The down-conversion of the digital IF signal to the digital baseband signal may utilize, for example, decimation filters where the input frequency of the decimation filter may be a multiple of the output frequency of the decimation filter. The digital filtering of the digital samples may utilize a derotator that may utilize a coordinate rotation digital calculation (CORDIC) algorithm.

In operation, the RF signal, which may have a carrier frequency referred to as $f_{RF}$, may be received by an antenna and communicated to the amplifier 210, where the RF signal may be amplified by the amplifier 210. The amplified RF signal may be communicated to an input of the mixer 212. The output signal of the LO 214, which may have a frequency of $f_{LO}=f_{RF}+f_{IF}$ or $f_{LO}=f_{RF}-f_{IF}$, may be communicated to another input of the mixer 212, where $f_{IF}$ may be a desired intermediate frequency. The mixer 212 may process the two input signals such that the output signal may have a desired frequency. The mixer 212 output signal may be referred to as an IF signal.

The IF signal may be communicated to a bandpass filter 216, which may be adapted to pass the desired bandwidth of signals about the IF frequency $f_{IF}$, while attenuating the undesired frequencies in the IF signal. The filtered IF signal may be amplified by the amplifier 218, and the amplified IF signal may be communicated to the baseband generator 220. The baseband signal output by the baseband generator 220 may be communicated to the baseband processor 154 for further processing. The processing may comprise, for example, filtering and/or amplifying.

Figure 2B:
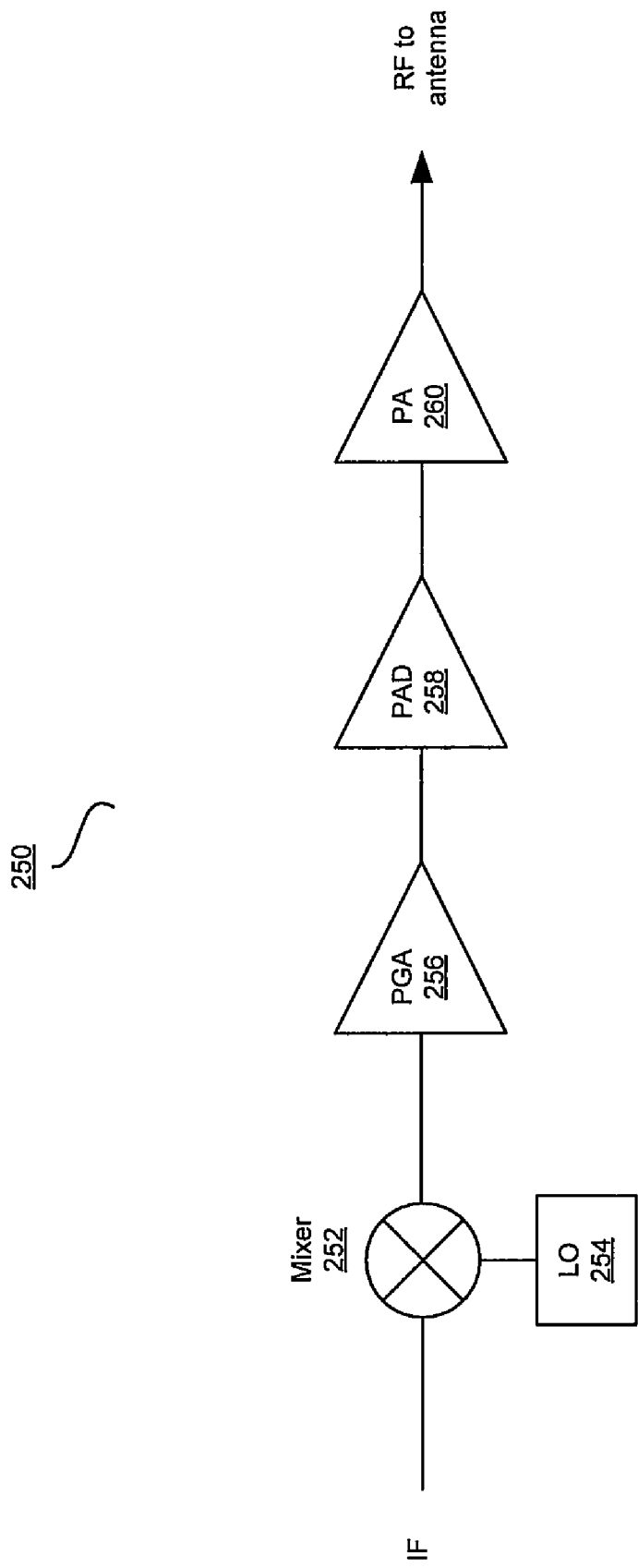
FIG. 2B is a block diagram illustrating an exemplary RF transmitter front end, in accordance with an embodiment of the invention.

FIG. 2B is a block diagram illustrating an exemplary RF transmitter front end, in accordance with an embodiment of the invention. Referring to FIG. 2B, there is shown an exemplary transmit path 250 that comprises a mixer 252, a local oscillator (LO) generator 254, a programmable gain amplifier (PGA) 256, a power amplifier driver (PAD) 258, and a power amplifier (PA) 260. The mixer 252 may upconvert a baseband signal to RF signal used for transmission using a mixing signal from the LO 254. The LO 254 is described in more detail with respect to FIGS. 3-5. The PGA 256 may amplify an input signal with variable gain to generate an output signal. The gain of the PGA 256 may be adjusted by circuitry and/or a processor, such as, for example, the baseband processor 154 or the processor 156. The PAD 258 and the PA 260 may each amplify an input signal to generate an output signal.

In operation, the input signal to the mixer 252 may be upconverted to radio frequency (RF), and the RF signal from the outputs of the mixer 252 may be communicated to the PGA 256. The mixer 252, the PGA 256, the PAD 258, and the PA 260 may comprise devices that amplify signals, for example. Accordingly, the RF signal may be amplified to a level sufficient for transmission.

Figure 3:
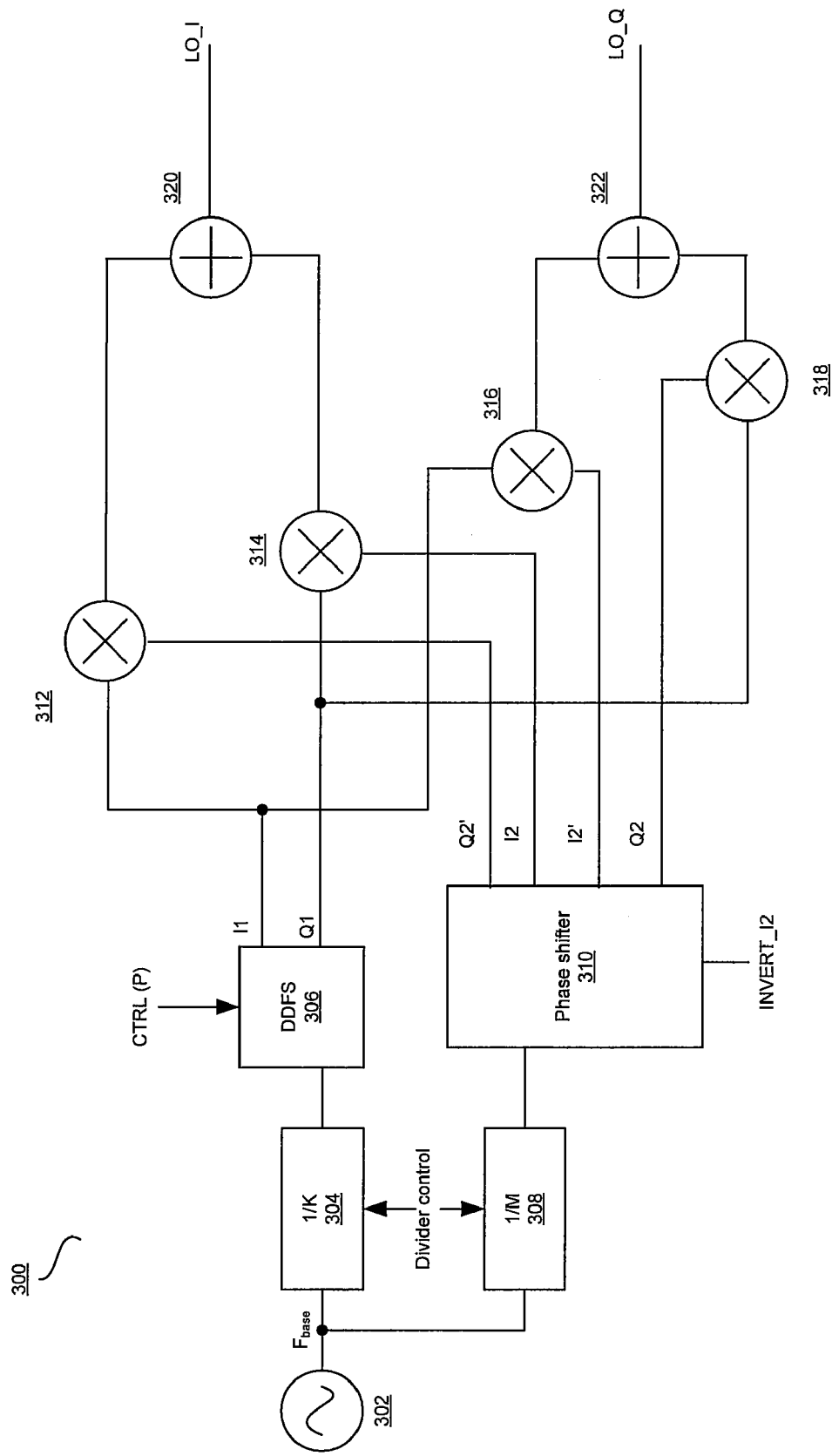
FIG. 3 is a block diagram of an exemplary quadrature local oscillator generator using DDFS, in accordance with an embodiment of the invention.

FIG. 3 is a block diagram of an exemplary local oscillator generator based on quadrature mixing using a phase shifter, in accordance with an embodiment of the invention. Referring to FIG. 3, there is shown a local oscillator generator 300 comprising a frequency source 302, divider blocks 304 and 308, DDFS 306, a phase shifter block 310, mixers 312, 314, 316, and 318, and signal combiners 320 and 322.

The frequency source 302 may comprise suitable logic and/or circuitry that may enable generation of a base signal $F_{base}$ at a specific frequency. The frequency source 302 may, for example, generate an output signal that may be variable in frequency, where the frequency may be controlled by a voltage signal. The divider blocks 304 and 308 may comprise suitable logic, circuitry, and/or code that may enable receiving an input signal and generating an output signal whose frequency may be divided by a divide factor N, where N may be 2 or more. The output signal generated by the divider block 304 may be used, for example, as a reference clock for the DDFS 306. The divider block 304 or 308 may receive a signal from the frequency source 302 having a frequency $F_{in}$, and output a signal having a frequency $F_{out}$:

$$F_{out} = \frac{F_{in}}{N} \quad [1]$$

where N may represent a divide factor utilized by the divider block 304 or 308. The divide factor N may be, for example, different for the divider block 304 than for the divider block 308. The divide factor N for each of the divider blocks 304 and 308 may be, for example, set to a specific value, or variable. The divide factor N may be determined by, for example, a processor such as the baseband processor 154 and/or the processor 156.

The DDFS 306 may generate at least one output signal that may be used to generate a LO signal for transmission and/or reception of RF signals by the wireless system 150. The DDFS 306 may output, for example, I and Q signals for generating I and Q local oscillator signals. The frequencies of the signals generated by the DDFS 306 may be controlled by, for example, a processor such as the baseband processor 154 and/or the processor 156. Operation of an exemplary DDFS is discussed with respect to FIG. 4.

The phase shifter block 310 may comprise suitable logic and/or circuitry that may enable receiving an input signal and generating two output signals where the two output signals may be, for example, 90° out of phase with respect to each other. The phase shifter block 310 may also generate additional output signals that may be controlled to be an inverted version of the first two output signals. An inverted version of an original signal may be, for example, 180° out of phase with respect to the original signal. For example, the phase shifter block 310 may output the signals I2, Q2, I2', and Q2'. The signal I2' may be controlled to be either a non-inverted version of the signal I2 or an inverted version of the signal I2. Similarly, the signal Q2' may be controlled to be either a non-inverted version of the signal I2 or an inverted version of the signal I2. The phase of the signals I2' and Q2' may be controlled by, for example, a signal INVERT_I2. When the signal INVERT_I2 is unasserted, the signal I2' may be a non-inverted version of the signal I2, and the signal Q2' may be an inverted version of the signal Q2. When the signal INVERT_I2 is asserted, the signal I2' may be an inverted version of the signal I2, and the signal Q2' may be a non-inverted version of the signal Q2.

The mixers 312, 314, 316, and 318 may comprise suitable circuitry that may enable mixing two signals. The signal combiners 320 and 322 may comprise, for example, wire-ORing when the signals to be combined are currents. For example, since the mixers 312, 314, 316, and 318 may output current signals, the outputs of the mixers 312 and 314 may be directly electrically connected together to combine the currents output by the mixers 312 and 314. Similarly, the outputs of the mixers 316 and 318 may be combined by a similar configuration.

In operation, the frequency source 302 may generate a signal at a frequency that may be desired for use in generating the signals LO_I and LO_Q at the outputs of the signal combiners 320 and 322, respectively. The frequency source 302 may comprise, for example, a voltage controlled oscillator. The frequency of the frequency source 302 may be controlled by, for example, a processor such as the baseband processor 154 and/or the processor 156. The signal generated by the frequency source 302 may be communicated to the divider blocks 304 and 308.

The divider block 304 may divide the frequency of the input signal by an appropriate divide factor and communicate the reduced frequency signal to the DDFS 306. The divider block 308 may divide the frequency of the input signal by an appropriate divide factor and communicate the reduced frequency signal to the phase shifter block 310. Various embodiments of the invention may fix a divide factor by which the divider block 304 and/or the divider block 310 may divide an input frequency. Other embodiments of the invention may allow a divide factor by which the divider block 304 and/or the divider block 310 may divide an input frequency to be variable. For example, the baseband processor 154 and/or the processor 156 may control the divide factor by which the divider block 304 and/or the divider block 310 may divide an input frequency.

The DDFS 306 may receive the signal from the divider block 304 and may output a signal that comprises an in-phase component I1 and a quadrature phase component Q1. The in-phase component I1 may be communicated to the mixers 312 and 316, and the quadrature phase component Q1 may be communicated to the mixers 314 and 318. The phase shifter block 310 may receive a signal from the divider block 308 and output an in-phase signal component I2 and a quadrature phase signal component Q2. The in-phase signal component I2 may be communicated to the mixer 314, and the quadrature phase signal component Q2 may be communicated to the mixer 318. The phase shifter block 310 may also generate a signal I2' and a signal Q2'. The signal I2' may be controlled to be either the signal component I2 or an inverted version of the signal component I2. Similarly, the signal Q2' may be controlled to be either the signal component Q2 or an inverted version of the signal component Q2.

The phase of the signals I2' and Q2' may be controlled by, for example, the signal INVERT_I2. The signal INVERT_I2 may be communicated by, for example, the processor 156 and/or the baseband processor 154. An embodiment of the invention may enable generation of the signals I2' and Q2' such that when the signal I2' is an inverted version of the signal component I2, the signal Q2' may be a non-inverted version of the signal component Q2, and when the signal I2' is a non-inverted version of the signal component I2, the signal Q2' may be an inverted version of the signal component Q2.

The I1 and I2 signal components may be described as, for example, sin(A) and sin(B), and the Q1 and Q2 signal components may be described as, for example, cos(A) and cos(B). Accordingly, the mixer 312 may multiply the signals I1 and Q2' to result in an output signal I1*Q2' that may be written as sin(A)*cos(B) when the phase shifter block 310 outputs the signal Q2' as a non-inverted version of the signal component Q2. When the phase shifter block 310 outputs the signal Q2' as an inverted version of the signal Q2, the output signal I1*Q2' may be written as [−(sin(A)*cos(B))]. By using a trigonometric identity, sin(A)*cos(B) may be written as ½[sin(A+B)+sin(A−B)]. Similarly, the mixer 314 may multiply the components I2 and Q1 to result in an output signal I2*Q1 that may be written as sin(B)*cos(A). By using a trigonometric identity, sin(B)*cos(A) may be written as ½[ sin(B+A)+sin(B−A)]. The outputs of the mixers 312 and 314 may be combined by the signal combiner 320, and the result may be an in-phase component LO_I of a local oscillator signal. When the signal Q2' is a non-inverted version of the signal component Q2, the output of the signal combiner 320 may be sin(A)*cos(B), which may be expressed as:

$$LO\_I = \frac{1}{2}[\sin(A+B) + \sin(A-B)] + \quad [2]$$
$$\frac{1}{2}[\sin(B+A) + \sin(B-A)]$$
$$= \sin(A+B) + \frac{1}{2}[\sin(A-B) + \frac{1}{2}[\sin(B-A)]$$
$$= \sin(A+B) + \frac{1}{2}[\sin(A)\cos(B) - \cos(A)\sin(B)] +$$
$$\frac{1}{2}[\sin(B)\cos(A) - \cos(B)\sin(A)]$$
$$= \sin(A+B).$$

When the signal Q2' is an inverted version of the signal component Q2, the output of the signal combiner 320 may be −sin(A)*cos(B), which may be expressed as:

$$LO\_I = -\frac{1}{2}[\sin(A+B) + \sin(A-B)] + \quad [3]$$
$$\frac{1}{2}[\sin(B+A) + \sin(B-A)]$$
$$= -\frac{1}{2}[\sin(A-B)] + \frac{1}{2}[\sin(B-A)]$$
$$= -\frac{1}{2}[\sin(A)\cos(B) - \cos(A)\sin(B)] +$$
$$\frac{1}{2}[\sin(B)\cos(A) - \cos(B)\sin(A)]$$
$$= -\sin(A)\cos(B) + \cos(A)\sin(B)$$

-continued
$$= -\frac{1}{2}[\sin(A+B) + \sin(A-B)] +$$
$$\frac{1}{2}[\sin(A+B) - \sin(A-B)]$$
$$= \sin(A-B).$$

Accordingly, by appropriately controlling the signal Q2' generated by the phase shifter block 310, the in-phase component LO_I may comprise either a sum of the frequencies A and B, or a difference of the frequencies A and B.

Similarly, the mixer 316 may multiply the signals I1 and I2' to result in an output signal I1*I2' that may be written as sin(A)*sin(B) when the phase shifter block 310 outputs the signal I2' as a non-inverted version of the signal component Q2. When the phase shifter block 310 outputs the signal I2' as an inverted version of the signal component I2, the output signal I1*Q2' may be written as [−(sin(A)*sin(B))]. The mixer 318 may multiply the input signal components Q1 and Q2 to generate an output signal Q1*Q2 that may be written as cos(A)*cos(B).

By using a trigonometric identity, −sin(A)*sin(B) may be written as ½[cos(A+B)−cos(A−B)]. By using a trigonometric identity, cos(A)*cos(B) may be written as ½[cos(A+B)+cos (A−B)]. The outputs of the mixers 316 and 318 may be combined by the signal combiner 322, and the result may be the quadrature phase component LO_Q of the local oscillator signal. When the signal I2' is an inverted version of the signal component I2, the output of the signal combiner 322 may be −sin(A)*sin(B), which may be expressed as:

$$LO\_Q = \frac{1}{2}[\cos(A+B)-\cos(A-B)] + \frac{1}{2}[\cos(A+B)+\cos(A-B)] = \cos(A+B). \quad [4]$$

When the signal I2' is a non-inverted version of the signal component I2, the output of the signal combiner 322 may be sin(A)*sin(B), which may be expressed as:

$$LO\_Q = -\frac{1}{2}[\cos(A+B)-\cos(A-B)] + \frac{1}{2}[\cos(A+B)+\cos(A-B)] = \cos(A-B). \quad [5]$$

Accordingly, by appropriately controlling the phase of the signal I2' generated by the phase shifter block 310, the quadrature phase component LO_Q may comprise either a sum of the frequencies A and B, or a difference of the frequencies A and B.

Therefore, an embodiment of the invention may output the components LO_I and LO_Q of the local oscillator signal with a frequency that may be a sum of the frequencies of the signals from the DDFS 306 and the phase shifter block 310 by, for example, asserting the signal INVERT_I2 to the phase shifter block 310. Accordingly, the phase shifter block 310 may output the signal I2' that may be an inverted version of the signal I2, and the signal Q2' that may be a non-inverted version of the signal Q2.

An embodiment of the invention may also output the components LO_I and LO_Q with a frequency that may be a difference of the frequencies of the signals from the DDFS 306 and the phase shifter block 310 by, for example, de-asserting the signal INVERT_I2 to the phase shifter block 310. Accordingly, the phase shifter block 310 may output the signal I2' that may be a non-inverted version of the signal I2, and the signal Q2' that may be an inverted version of the signal Q2. Generation of the LO_I and LO_Q components of the local oscillator signal by mixing and combining as described by the equations [2]-[5] may be referred to as quadrature mixing.

While an embodiment of the invention has been described that comprises the divider blocks 304 and 308, the invention need not be so limited. For example, the base signal $F_{base}$ may be communicated to the DDFS 306 and/or the phase shifter block 310 without being divided by the divider block 304 and/or 308, respectively. Various embodiments of the invention may combine, for example, the divider block 308 and the phase shifter block 310 into a single functional block. Additionally, various embodiments of the invention may use one of the divider blocks 304 and 308, or neither of the divider blocks 304 and 308.

Figure 4:
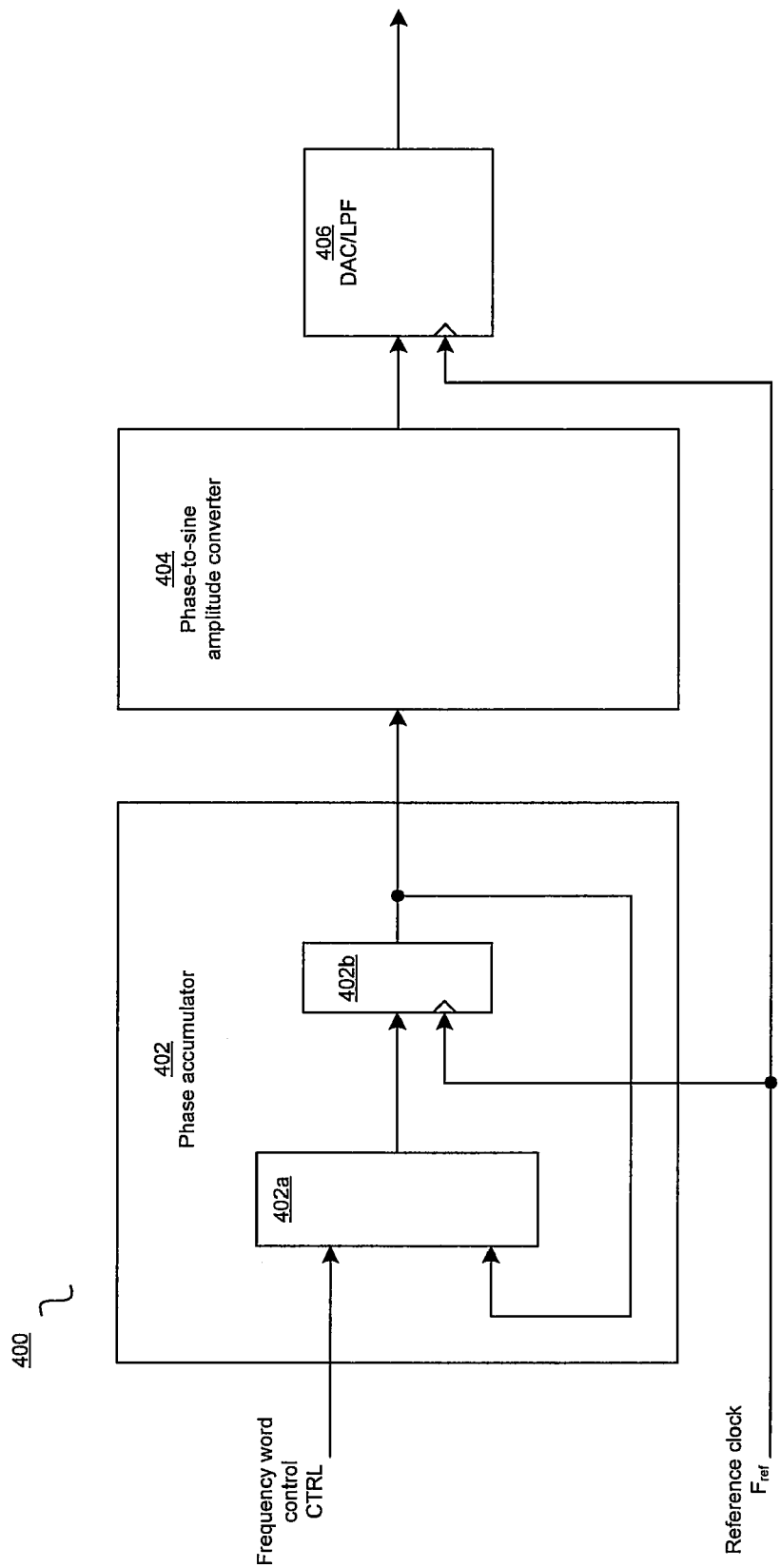
FIG. 4 is a block diagram illustrating an exemplary direct digital frequency synthesizer, in accordance with an embodiment of the invention.

FIG. 4 is a block diagram illustrating an exemplary direct digital frequency synthesizer, in accordance with an embodiment of the invention. Referring to FIG. 4, there is shown a direct digital frequency synthesizer (DDFS) 400 comprising a phase accumulator 402, a phase-to-sine amplitude converter 404, and a digital to analog converter (DAC) 406. The DDFS 400 may be similar in functionality to the DDFS 306. The phase accumulator 402 may comprise an adder 402a that may enable integrating an input signal, such as, for example, a frequency control word CTRL, by adding it to a previous integrated value stored in a register 402b on each cycle of a reference clock $F_{ref}$. The frequency control word CTRL may be provided by, for example, the processor 156 and/or the baseband processor 154. Various embodiments of the invention may also comprise a control word block (not shown) that may be used to provide the control word. The reference clock $F_{ref}$ may be communicated by, for example, the divider block 304. The reference clock $F_{ref}$ may be fixed-frequency or varying frequency. In the case of a varying reference clock $F_{ref}$, the change in frequency may be compensated by altering the frequency control word CTRL such that the output of the DDFS may comprise a desired frequency and/or phase.

The phase-to-sine amplitude converter 404 may comprise suitable logic, circuitry, and/or code that may enable converting the output of the phase accumulator 402 to an approximated sine amplitude. For example, the conversion may be achieved via a look-up table. Although only a single output may be shown for exemplary purposes, a plurality of signals may be generated where each signal may be phase shifted from the others. For example, where I and Q signals may be needed, the phase-to-sine amplitude converter 404 may utilize a plurality of different look-up tables for each input value. In an exemplary embodiment of the invention, a first look-up table may be utilized for the I signal and a second look-up table may be utilized for the Q signal.

The DAC 406 may comprise suitable logic and/or circuitry that may enable converting the digital output of the phase-to-sine amplitude converter 404 to an analog output. The DAC 406 may also comprise, for example, a low-pass filter that may be used to "smooth" the analog output. Where the DDFS 400 may generate, for example, I and Q signals, there may be a DAC for generating an I signal and a DAC for generating a Q signal. Accordingly, the DDFS 400 may be a digitally-controlled signal generator that may vary phase, frequency, and/or amplitude of one or more output signals based on a single reference clock $F_{ref}$ and a frequency control word CTRL.

In operation, the frequency control word CTRL may be provided to the adder 402a, and may be successively added to an integrated value stored in the register 402b. The adding may occur, for example, on each cycle of the reference clock $F_{ref}$. In this manner, the sum may eventually be greater than the maximum value the accumulator can store, and the value in the accumulator may overflow or "wrap". Accordingly, an N-bit phase accumulator 402 may overflow at a frequency $F_{out}$ given by the following equation:

$$F_{out}=(F_{ref}*CTRL)/2^N \qquad [6]$$

In this manner, the output of the phase accumulator 402, which may be referred to as $F_{out}$, may be periodic at a period of $1/F_{out}$ and may represent the phase angle of a signal. In this regard, the DDFS 422 may operate as a frequency generator that generates one or more sine waves or other periodic waveforms over a large range of frequencies, from almost DC to approximately half the reference clock frequency $F_{ref}$.

Prior to changing the frequency control word CTRL, the state of the DDFS 400 may be saved in, for example, a memory such as the system memory 158. In this manner, the output signal $F_{out}$ may be interrupted and then resumed without losing the phase information comprising the generated signals. For example, the DDFS 400 may resume generating the output signal $F_{out}$ using the saved state loaded from, for example, the system memory 158. Accordingly, the output signal $F_{out}$ may resume from the last phase angle transmitted before the signal was interrupted.

Figure 5:
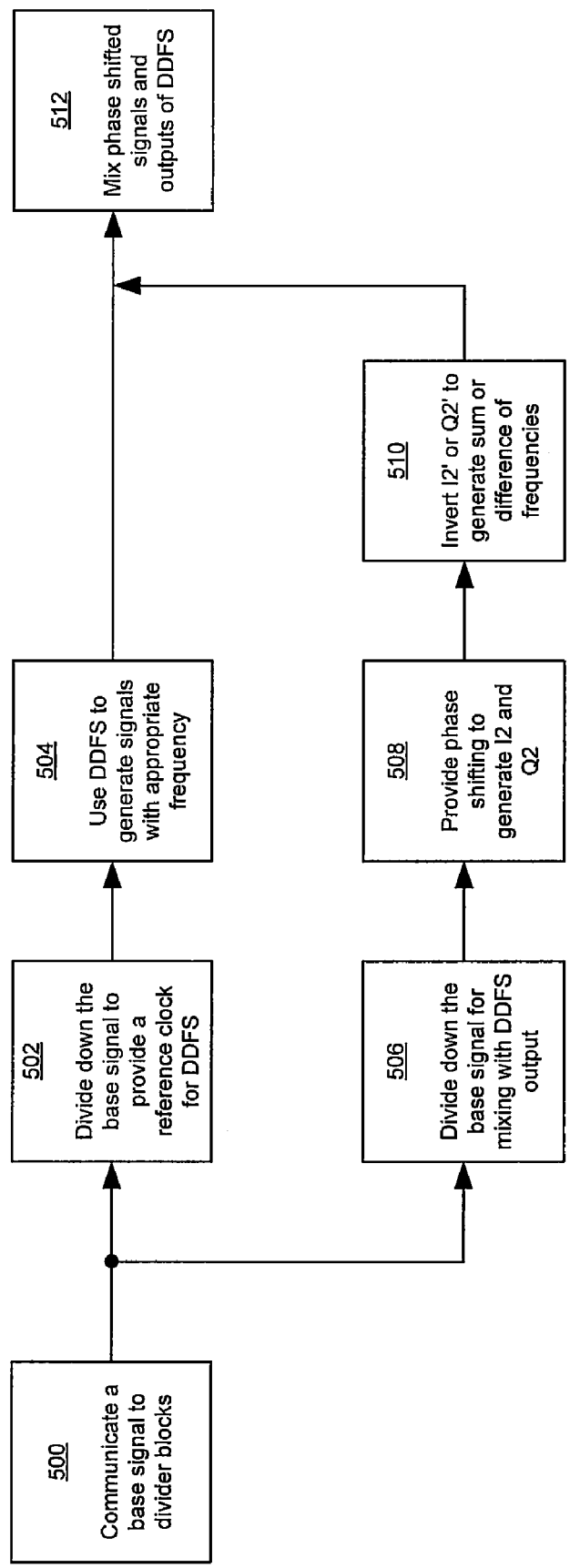
FIG. 5 is a flow diagram illustrating exemplary steps for using an exemplary quadrature local oscillator generator using DDFS, in accordance with an embodiment of the invention.

FIG. 5 is a flow diagram illustrating exemplary steps for using a local oscillator generator based on quadrature mixing using a phase shifter, in accordance with an embodiment of the invention. Referring to FIG. 5, there is shown steps 500 to 512. In step 500, the frequency source 302 may generate a signal $F_{base}$ with a desired frequency, where the desired frequency may be design dependent. The frequency of the generated signal may be divided in steps 502 and 506. In step 502, the divider block 304 may reduce the frequency of the input signal $F_{base}$, for example, by a divide factor K, such that the output of the divider block 304 may be a signal $F_{ref}$, where the frequency of the signal $F_{ref}$ may be $F_{base}/K$. The output signal $F_{ref}$ of the divider block 304 may be communicated to the DDFS 306 as a reference clock.

In step 504, the DDFS 306 may use the reference clock $F_{ref}$ to generate the in-phase and quadrature phase components I1 and Q1. The frequency of the output signal components I1 and Q1 may depend on the frequency control word CTRL that may be communicated to the DDFS 306 by, for example, the baseband processor 154 and/or the processor 156. The components I1 and Q1 may have a frequency that may be described by:

$$I1=Q1=F_{base}*(CTRL/(K*2^N)). \qquad [7]$$

The next step from step 504 may be step 512.

In step 506, the divider block 308 may reduce the frequency of the input signal $F_{base}$, for example, by a divide factor M, such that the output of the divider block 308 may have a frequency that may be $F_{base}/M$. In step 508, the output of the divider block 308 may be communicated to the phase shifter block 310. The phase shifter block 310 may output two signal components I2 and Q2 where the frequencies of the signal components I2 and Q2 may be the same as the frequency of the input signal. However, the signal components I2 and Q2 may have a phase difference of 90° with respect to each other.

In step 510, the phase shifter block 310 may provide appropriate additional phase shifting to the signals I2' and Q2'. The additional phase shifting may comprise, for example, shifting the signal I2 by 180° or the signal Q2 by 180°. Accordingly, the signal I2, when shifted by 180° with respect to the signal I2, may be an inverted version of the signal I2. Similarly, when the signal Q2' is shifted by 180° with respect to the signal Q2, the signal Q2' may be an inverted version of the signal Q2. The additional phase shifting may be used, for example, based on whether the local oscillator signal may comprise a frequency that is a sum or a difference of the frequencies of the signals generated by the DDFS 306 and the phase shifter block 310. While the step 510 is described as following the step 508, the invention need not be so limited. For example, various embodiments of the invention may perform the steps 508 and 510 in parallel.

In step 512, the mixer 312 may mix the signal components I1 and Q2', the mixer 314 may mix the signal components I2 and Q1, the mixer 316 may mix the signal components I1 and I2', and the mixer 318 may mix the signal components Q1 and Q2. The outputs of the mixers 312 and 314 may be combined to generate the in-phase signal component LO_I of the local oscillator signal, and the outputs of the mixers 316 and 318 may be combined to generate the quadrature phase signal component LO_Q of the local oscillator signal.

By controlling the phase adjuster block 310 so that the phase of the signal I2' is an inverted version of the signal component I2, while the signal Q2' is a non-inverted version of the signal component Q2, the signal components LO_I and LO_Q may be a sum of the frequencies of the signals generated by the DDFS 306 and the phase shifter block 310. By controlling the phase adjuster block 310 so that the phase of the signal Q2' is an inverted version of the signal component Q2, while the signal I2' is a non-inverted version of the signal component I2, the signal components LO_I and LO_Q may be a difference of the frequencies of the signals generated by the DDFS 306 and the phase shifter block 310. Whether the phase adjuster block 310 inverts the signal I2' or Q2' may be controlled by, for example, a processor such as the baseband processor 154 and/or the processor 156. The output signal components LO_I and LO_Q may be used, for example, for down-conversion in the receiver front end 153 and/or up-conversion in the transmitter front end 152.

In accordance with an embodiment of the invention, aspects of an exemplary system may comprise, for example, the frequency source 302, the divider blocks 304 and 308, the DDFS 306, the phase shifter block 310, the mixers 312, 314, 316, and 318, and combiners 320 and 322. The frequency source 302 may generate a base signal, where the base signal may be communicated to, for example, the divider blocks 304 and 308. The divider block 304 may reduce the frequency of the base signal by a factor greater than one and communicate the reduced frequency signal to the DDFS 306 as a reference clock signal. The DDFS 306 may generate a first signal that may comprise an in-phase component I1 and a quadrature phase component Q1. The DDFS 306 may be controlled by, for example, the baseband processor 154 and/or the processor 156 that may communicate one or more frequency control words to the DDFS 306. The frequency control words and the reference clock signal may, for example, determine a frequency of the first signal.

The divider block 308 may reduce the frequency of the base signal by a factor greater than one and communicate the reduced frequency signal to the phase shifter block 310. The phase shifter block 310 may generate a second signal that may comprise an in-phase signal component I2 and a quadrature phase signal component Q2. The phase shifter block 310 may also generate signals I' and Q' that may have a same frequency as the signal components I2 and Q2. The signal I' may be controlled to be either in phase with respect to the in-phase signal component I2 or 180° out of phase with respect to the in-phase signal component I2. When the signal I' is 180° out of phase with respect to the in-phase signal component I2, it may be referred to as an inverted version of the in-phase signal component I2.

The signal Q' may be controlled to be either in phase with respect to the quadrature phase signal component Q2 or 180° out of phase with respect to the quadrature phase signal component Q2. When the signal Q' is 180° out of phase with respect to the quadrature phase signal component Q2, it may be referred to as an inverted version of the quadrature phase signal component Q2. The signal components I1 and Q1, the signal components I2 and Q2, and the signals I' and Q' may be quadrature mixed, where the mixers 312, 314, 316, and 318 mix various signals and the outputs of the mixers 312, 314, 316, and 318 are combined by the combiners 320 and 322 to generate in-phase and quadrature phase signal components LO_I and LO_Q, respectively, of a local oscillator signal.

The quadrature mixing may comprise, for example, the mixer 312 mixing the I1 component of the first signal and the signal Q' to generate a third signal, where the signal Q' may comprise a same frequency as the signal component Q2. A phase of the signal Q' may be controlled by, for example, the signal INVERT_I2 from the baseband processor 154 and/or the processor 156. The quadrature mixing may also comprise the mixer 314 mixing the component I2 and the component Q1 to generate a fourth signal.

The quadrature mixing may also comprise the mixer 316 mixing the signal component I1 and the signal I' to generate a fifth signal, wherein the signal I' may comprises a same frequency as the signal component I2, and a phase of the signal I' may be either in phase with respect to the in-phase signal component I2 or 180° out of phase with respect to the in-phase signal component I2. The quadrature mixing may also comprise the mixer 318 mixing the signal component Q1 and the signal component Q2 to generate a sixth signal.

The quadrature mixing may comprise the combiner 320 combining the third signal and the fourth signal to generate the in-phase component LO_I of the local oscillator signal. The quadrature mixing may comprise the combiner 322 combining the fifth signal and the sixth signal to generate the quadrature phase component LO_Q of the local oscillator signal.

The phase of the signals I' and Q' may be controlled by, for example, the signal I2_INVERT, where the signal I2_INVERT may be generated by one or more processors such as, for example, the processor 156 and/or the baseband processor 154. Assertion of the signal I2_INVERT may, for example, indicate to the phase shifter block 310 to generate the signals I' and Q' such that that the signal I' may be in phase with respect to the signal component I2 and the signal Q' may be 180° out of phase with respect to the signal component Q2. Accordingly, the LO_I and LO_Q components of the local oscillator signal may have a frequency that may be a sum of the frequency of the first signal and the frequency of the second signal.

Similarly, deassertion of the I2_INVERT signal may, for example, indicate to the phase shifter block 310 to generate the signals I' and Q' such that the signal I' may be 180° out of phase with respect to signal component I2, and the signal Q' may be in phase with respect to the signal component Q2. Accordingly, the LO_I and LO_Q components of the local oscillator signal may have a frequency that may be a difference of the frequency of the first signal and the frequency of the second signal.

Another embodiment of the invention may provide a machine-readable storage, having stored thereon, a computer program having at least one code section executable by a machine, thereby causing the machine to perform the steps as described above for a local oscillator generator based on quadrature mixing using a phase shifter.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing signals, the method comprising:
    generating via a direct digital frequency synthesizer, a first signal based on a base signal;
    generating a second signal based on said base signal; and
    quadrature mixing in-phase (I) and quadrature phase (Q) components of said first signal, in-phase (I) and quadrature phase (Q) components of said second signal, and signals I' and Q' to generate a local oscillator signal comprising an in-phase (I) component and a quadrature phase (Q) component, wherein said I' signal comprises a same frequency as said I component of said second signal, and a phase of said I' signal is one of: in phase with respect to said I component of said second signal or 180° out of phase with respect to said I component of said second signal, and wherein said Q' signal comprises a same frequency as said Q component of said second signal, and a phase of said Q' signal is one of: in phase with respect to said Q component of said second signal or 180° out of phase with respect to said Q component of said second signal.

2. The method according to claim 1, wherein said quadrature mixing comprises:
    mixing said I component of said first signal and said Q' signal to generate a third signal;
    mixing said I component of said second signal and said Q component of said first signal to generate a fourth signal;
    mixing said I component of said first signal and said I' signal to generate a fifth signal; and
    mixing said Q component of said first signal and said Q component of said second signal to generate a sixth signal.

3. The method according to claim 2, comprising:
    combining said third signal and said fourth signal to generate said in-phase component of a local oscillator signal; and
    combining said fifth signal and said sixth signal to generate said quadrature phase component of said local oscillator signal.

4. The method according to claim 2, comprising generating said I' signal and said Q' signal such that when said I' signal is in-phase with respect to said I component of said second signal, said Q' signal is 180° out of phase with respect to said Q component of said second signal.

5. The method according to claim 4, wherein when said I' signal is in phase with respect to said I component of said second signal, each of said in-phase component of a local oscillator signal and said quadrature phase component of a local oscillator signal comprises a frequency that is a difference of a frequency of said first signal and a frequency of said second signal.

6. The method according to claim 2, comprising generating said I' signal and said Q' signal such that when said Q' signal is in-phase with respect to said Q component of said second signal, said I' signal is 180° out of phase with respect to said I component of said second signal.

7. The method according to claim 6, wherein when said Q' signal is in phase with respect to said Q component of said second signal, each of said in-phase component of a local oscillator signal and said quadrature phase component of a local oscillator signal comprises a frequency that is a sum of a frequency of said first signal and a frequency of said second signal.

8. The method according to claim 1, comprising communicating one or more frequency control words to said direct digital frequency synthesizer to control generation of said first signal.

9. A non-transitory machine-readable storage having stored thereon, a computer program having at least one code section for processing signals, the at least one code section being executable by a machine for causing the machine to perform steps comprising:
    generating via a direct digital frequency synthesizer, a first signal based on a base signal;
    generating a second signal based on said base signal; and
    quadrature mixing in-phase (I) and quadrature phase (Q) components of said first signal, in-phase (I) and quadrature phase (Q) components of said second signal, and signals I' and Q' to generate a local oscillator signal comprising an in-phase (I) component and a quadrature phase (Q) component, wherein said I' signal comprises a same frequency as said I component of said second signal, and a phase of said I' signal is one of: in phase with respect to said I component of said second signal or 180° out of phase with respect to said I component of said second signal, and wherein said Q' signal comprises a same frequency as said Q component of said second signal, and a phase of said Q' signal is one of: in phase with respect to said Q component of said second signal or 180° out of phase with respect to said Q component of said second signal.

10. The non-transitory storage according to claim 9, wherein said quadrature mixing comprises:
    mixing said I component of said first signal and said Q' signal to generate a third signal;
    mixing said I component of said second signal and said Q component of said first signal to generate a fourth signal;
    mixing said I component of said first signal and said I' signal to generate a fifth signal; and mixing said Q component of said first signal and said Q component of said second signal to generate a sixth signal.

11. The non-transitory machine-readable storage according to claim 10, wherein said quadrature mixing comprises:
   combining said third signal and said fourth signal to generate said in-phase component of a local oscillator signal; and
   combining said fifth signal and said sixth signal to generate said quadrature phase component of said local oscillator signal.

12. The non-transitory machine-readable storage according to claim 10, wherein the at least one code section comprises code that enables generation of said I' signal and said Q' signal such that when said I' signal is in-phase with respect to said I component of said second signal, said Q' signal is 180° out of phase with respect to said Q component of said second signal.

13. The non-transitory machine-readable storage according to claim 12, wherein when said I' signal is in phase with respect to said I component of said second signal, each of said in-phase component of a local oscillator signal and said quadrature phase component of a local oscillator signal comprises a frequency that is a difference of a frequency of said first signal and a frequency of said second signal.

14. The non-transitory machine-readable storage according to claim 10, wherein the at least one code section comprises code that enables generation of said I' signal and said Q' signal such that when said Q' signal is in-phase with respect to said Q component of said second signal, said I' signal is 180° out of phase with respect to said I component of said second signal.

15. The non-transitory machine-readable storage according to claim 14, wherein when said Q' signal is in phase with respect to said Q component of said second signal, each of said in-phase component of a local oscillator signal and said quadrature phase component of a local oscillator signal comprises a frequency that is a sum of a frequency of said first signal and a frequency of said second signal.

16. The non-transitory machine-readable storage according to claim 9, wherein the at least one code section comprises code that enables communication of one or more frequency control words to said direct digital frequency synthesizer to control generation of said first signal.

17. A system for processing signals, the system comprising:
   one or more circuits that comprise a direct digital frequency synthesizer, wherein said direct digital frequency synthesizer enables generation of a first signal based on a base signal;
   said one or more circuits enable generation of a second signal based on said base signal; and
   said one or more circuits enable quadrature mixing of in-phase (I) and quadrature phase (Q) components of said first signal, in-phase (I) and quadrature phase (Q) components of said second signal, and signals I' and Q' to generate a local oscillator signal comprising an in-phase (I) component and a quadrature phase (Q) component, wherein said I' signal comprises a same frequency as said I component of said second signal, and a phase of said I' signal is one of: in phase with respect to said I component of said second signal or 180° out of phase with respect to said I component of said second signal, and wherein said Q' signal comprises a same frequency as said Q component of said second signal, and a phase of said Q' signal is one of: in phase with respect to said Q component of said second signal or 180° out of phase with respect to said Q component of said second signal.

18. The system according to claim 17, wherein said one or more circuits comprise:
   a first mixer that enables mixing of said I component of said first signal and said Q' signal to generate a third signal;
   a second mixer that enables mixing of said I component of said second signal and said Q component of said first signal to generate a fourth signal;
   a third mixer that enables mixing of said I component of said first signal and said I' signal to generate a fifth signal; and
   a fourth mixer that enables mixing of said Q component of said first signal and said Q component of said second signal to generate a sixth signal.

19. The system according to claim 18, wherein said one or more circuits comprise:
   a first combiner circuitry that enables combining of said third signal and said fourth signal to generate said in-phase component of a local oscillator signal; and
   a second combiner circuitry that enables combining of said fifth signal and said sixth signal to generate said quadrature phase component of said local oscillator signal.

20. The system according to claim 18, wherein said one or more circuits comprise a phase shifter that enables generation of said I' signal and said Q' signal such that when said I' signal is in-phase with respect to said I component of said second signal, said Q' signal is 180° out of phase with respect to said Q component of said second signal.

21. The system according to claim 20, wherein when said I' signal is in phase with respect to said I component of said second signal, each of said in-phase component of a local oscillator signal and said quadrature phase component of a local oscillator signal comprises a frequency that is a difference of a frequency of said first signal and a frequency of said second signal.

22. The system according to claim 18, wherein said one or more circuits comprise a phase shifter that enables generation of said I' signal and said Q' signal such that when said Q' signal is in-phase with respect to said Q component of said second signal, said I' signal is 180° out of phase with respect to said I component of said second signal.

23. The system according to claim 22, wherein when said Q' signal is in phase with respect to said Q component of said second signal, each of said in-phase component of a local oscillator signal and said quadrature phase component of a local oscillator signal comprises a frequency that is a sum of a frequency of said first signal and a frequency of said second signal.

24. The system according to claim 17, wherein said one or more circuits comprise one or more processors that enable controlling said direct digital frequency synthesizer utilizing one or more frequency control words.

25. The system according to claim 17, wherein said one or more circuits comprise one or more dividers that enable generation of said second signal by dividing said base signal by a divide factor greater than one.

* * * * *